(12) United States Patent
Keckes et al.

(10) Patent No.: US 9,476,116 B2
(45) Date of Patent: Oct. 25, 2016

(54) PROCESS FOR TREATING A PLASTIC COMPONENT PART

(71) Applicant: Oerlikon Surface Solutions AG, Trubbach, Trubbach (CH)

(72) Inventors: Antal Keckes, Gottmadingen (DE); Thomas Hermann, Stetten am kalten Markt (DE); Peter Schuler, Nagold (DE); Ruediger Schaefer, Grafenhausen (DE); Sascha Bauer, Messkirch (DE)

(73) Assignee: OERLIKON SURFACE SOLUTIONS AG, PFAFFIKON, Pfaffikon SZ (CH)

( * ) Notice: Subject to any disclaimer, the term of this patent is extended or adjusted under 35 U.S.C. 154(b) by 0 days.

(21) Appl. No.: 14/404,670

(22) PCT Filed: May 30, 2013

(86) PCT No.: PCT/EP2013/001595
§ 371 (c)(1),
(2) Date: Dec. 1, 2014

(87) PCT Pub. No.: WO2013/178363
PCT Pub. Date: Dec. 5, 2013

(65) Prior Publication Data
US 2015/0147588 A1 May 28, 2015

Related U.S. Application Data

(60) Provisional application No. 61/653,058, filed on May 30, 2012.

(51) Int. Cl.
| | | |
|---|---|---|
| C23C 14/20 | (2006.01) |
| C23C 14/00 | (2006.01) |
| C23C 14/58 | (2006.01) |
| C25D 11/04 | (2006.01) |
| C08J 7/04 | (2006.01) |
| B05D 7/02 | (2006.01) |
| B05D 7/00 | (2006.01) |

(52) U.S. Cl.
CPC ............... *C23C 14/205* (2013.01); *B05D 7/02* (2013.01); *B05D 7/53* (2013.01); *C08J 7/045* (2013.01); *C23C 14/0015* (2013.01); *C23C 14/20* (2013.01); *C23C 14/5853* (2013.01); *C25D 11/04* (2013.01); *B05D 7/57* (2013.01); *C08J 2323/12* (2013.01); *C08J 2333/12* (2013.01); *C08J 2355/02* (2013.01); *C08J 2369/00* (2013.01); *Y10T 428/12569* (2015.01)

(58) Field of Classification Search
CPC ..... C23C 14/00; C23C 14/02; C23C 14/024; C23C 14/025; C23C 14/06; C23C 14/14; C23C 14/20; C23C 14/58; C23C 14/5853; C23C 14/22; C23C 28/00; C23C 28/42; C23C 14/205; C23C 14/0015; Y10T 428/12556; Y10T 428/12569; Y10T 428/12583; Y10T 428/1259; Y10T 428/12611; Y10T 428/12632; Y10T 428/12639; Y10T 428/12667; Y10T 428/12736; Y10T 428/12743; Y10T 428/1275; Y10T 428/12764; Y10T 428/12806

See application file for complete search history.

(56) References Cited

U.S. PATENT DOCUMENTS

| | | |
|---|---|---|
| 6,168,242 B1 | 1/2001 | Mokerji |
| 7,132,130 B1 | 11/2006 | Kloss |
| 2002/0172843 A1 | 11/2002 | Mokerji |
| 2007/0020369 A1 | 1/2007 | Roy |
| 2007/0154693 A1 | 7/2007 | Tsai |

FOREIGN PATENT DOCUMENTS

| | | |
|---|---|---|
| DE | 103 37 456 A1 | 6/2004 |
| DE | 10 2010 019913 A1 | 12/2010 |
| EP | 1 484 428 A1 | 12/2004 |
| WO | 2010/127866 A2 | 11/2010 |

OTHER PUBLICATIONS

Machine Translation, Thomas, DE 102010019913, Dec. 2010.*
International Search Report for PCT/EP2013/001595 dated Nov. 22, 2013.

* cited by examiner

*Primary Examiner* — Michael E La Villa
(74) *Attorney, Agent, or Firm* — Pearne & Gordon LLP

(57) ABSTRACT

The present invention concerns a plastic component with a coating system, wherein the coating system comprises a basecoat of paint which has been applied to the surface of the plastic and on which a coating applied by means of vapor phase deposition is provided, for its part covered by a top coat of paint, characterized in that the coating applied by vapor phase deposition comprises multiple layers.

1 Claim, No Drawings

PROCESS FOR TREATING A PLASTIC COMPONENT PART

The present invention relates to a coating system deposited onto a plastic substrate. This coating system comprises a layer obtained by means of vapor phase deposition (PVD layer), which is embedded between two layers of paint (for example a basecoat below and a top coat above). Such a system is called hereinafter coating system. According to the invention, the layer deposited by vapor phase deposition comprises several, i.e. at least two, layers and is preferably an alternating layer system. Preferably, at least two of these layers have a different composition. This is preferably in the form of a PVD layer comprising several strata (PVD is short for physical vapor deposition, translated into German as "physical gas phase deposition" or "physical deposition from the gas phase").

The coating system according to the present invention can be used as a solution for various problems. Such a layer system is interesting not only in relation to decorative coatings but also affords many possibilities for the use of plastic components.

Some of these application possibilities are briefly outlined hereinafter by way of example:

EXAMPLE 1

In relation to the protection of pedestrians—protection in case of impact

The aim is to achieve a flat substrate that is optically metallic but simultaneously flexible and unbreakable and whose shape can be adapted to the component part.

According to the state of the art, this task is achieved by means of film technology or galvanization/electroplating; however, film technology is very expensive and galvanization has the disadvantage that sharp edges are produced.

According to the invention, the problem is solved in that the coating system is applied on flexible cost-effective plastic substrates or plastic component parts e.g. of PP and/or ABS. In this manner, the plastic substrate resp. the plastic component part remains flexible and break-resistant yet becomes optically metallic. By means of the above-mentioned PVD and painting technology, the coating system can be applied easily on substrates resp. component parts of various shapes and dimensions.

EXAMPLE 2

In relation to semi-transparent/Translux for ambient lighting and metallic shine without backlighting in high gloss or silky matt finish.

Existing technology: film technology and silver lacquering.

Problem resolution according to the present invention: coating system on transparent substrates, e.g. PC, PMMA.

EXAMPLE 3

In relation to component parts with backlit symbols.

Existing technology: paints, film technology and galvanization (BIA patent).

Problem resolution according to the present invention: coating system on semi-transparent or transparent substrates, e.g. PC, PMMA, with laser engraving PVD layer.

EXAMPLE 4

In relation to weight reduction and conservation of resources (no Cu and Ni).

Existing technology: galvanization.

Problem resolution according to the present invention: coating system with approx. 90% weight saving as compared with galvanized layer.

EXAMPLE 5

In relation to the recoatability of UV lacquers.

Existing technology: fluorinating, reactive plasma, atmospheric plasma

Problem resolution according to the present invention: UV surface activation with magnetron sputtering and reactive plasma

EXAMPLE 6

In relation to enhancing textured surfaces with PVD (direct metallization); the KS-structure can be incorporated into the tool or etching processes, lasering structure can be generated for easy-to-clean processes or for visual effect.

Existing technology: thick layers cover structures.

Problem resolution according to the present invention: PVD direct metallization with topcoat (gloss, silky-gloss)

EXAMPLE 7

In relation to the production of color coatings onto plastic surfaces.

Existing technology: create interference color by the generation of transparent layers by means of the PVD technology on plastic surfaces, for example by using cathode sputtering technology (e.g. magnetron sputtering). Such layers must generally have an accurate layer thickness in order to reflect a certain color. It is therefore very difficult to achieve a uniform color on non-planar surfaces using this technique.

Problem resolution according to the present invention: the colored layers [are produced] by anodic oxidation of Ti/Al layers that have been previously deposited by means of PVD techniques. Preferably, in accordance with the present invention, at least one coat layer is at first applied as a basecoat onto the substrate surface, after which the at least double-layer PVD coat (for example titanium or aluminum) is deposited, followed by the surface thus previously coated being subjected to an anodic oxidation process, and finally, at least yet another layer of paint is applied as a top coat.

EXAMPLE 8

In relation to the deposition of low-stress PVD coatings.

Existing technology: frequently, layers deposited by means of PVD have high residual stresses that lead to fractures or cracks within the layer.

Problem resolution according to the present invention: special process control to reduce the residual stresses within the PVD layer. This can for example be achieved in that the first layer of paint (basecoat) is applied in such a manner that the paint layer characteristics (e.g. hardness and/or modulus of elasticity and/or thickness) affect the generation of residual stresses in the subsequent deposition of the PVD layer in such a manner that the residual stresses within the PVD layer are lower.

EXAMPLE 9

In relation to the production of black plastic surfaces with a metallic appearance.

Existing technology: the surfaces are black metallized, resulting in the production of a certain conductivity of the surface, which is undesirable or not permitted for some applications.

Problem resolution according to the present invention: an already black plastic surface or the surface of a black plastic part is coated with a transparent metal oxide layer, thereby producing a metallic appearance due to optical effects.

Non-conductive metal oxide layers that are transparent achieve a metallic appearance with the right combination of layer thickness and black background.

Preferably, a basecoat can be first applied on the black plastic substrate, then an at least two-layer PVD coating of one or more transparent, electrically non-conductive metal oxides is deposited and finally a topcoat.

EXAMPLE 10

In relation to the generation of surfaces of plastic parts that can function as an electrical conductor or capacitor.

Problem with the prior art: flexibility and size.

Problem resolution according to the present invention:

Electrical conductor: applying an electrically conductive coating, for example by the deposition of a metallic, electrically conductive PVD layer. However, one problem here occurs when the electrically conductive PVD layer peels off, because the electrical conductivity is then interrupted.

A further variant, which could be used for the production of capacitors, is a multilayer coating system . . . PVD-layer/paint/PVD-layer/paint/PVD-layer/paint . . . . Preferably, for example, it is possible to deposit the concept of the coating system according to the present invention: basecoat+multi-layer (at least two-layer) PVD layer+topcoat directly onto a plastic substrate in order to achieve capacitive properties.

EXAMPLE 11

Relating to markings in nature.

Problems with the existing techniques: pollutants in nature.

Problem resolution according to the present invention: a combination of paint+PVD according to the present invention; PVD does not have a great environmental impact.

EXAMPLE 12

Relating to mirror, high reflection.

Problems with the existing techniques: weight, flexibility.

Problem resolution according to the present invention: generating mirror or high-reflection properties by the application of a coating system according to the present invention.

EXAMPLE 13

Relating to edge systems.

Problems with the existing techniques: high tooling costs for L-shaped bars—heavy handling.

Problem resolution according to the present invention: coating (application of a coating system according to the present invention) of a straight bar, which is formed later. Also possible for emblems at the rear.

The direct coating of topcoat on the basecoat is not possible but thanks to the concept of the coating system according to the present invention: basecoat+multi-layer (at least two-layered) PVD coating+topcoat, a much better paintability is made possible.

What is claimed is:

1. A process for treating a plastic component part comprising a surface, the process comprising the steps of:
    applying at least one base coat on the surface;
    depositing two vapor phase layers on the top of the at least one base coat;
    generating coloring layers by subjecting each of the two vapor phase layers to an anodic oxidation, respectively, and
    depositing at least one top coat on the coloring layers,
    wherein the two vapor phase layers are deposited by physical vapor deposition (PVD),
    one of the two vapor phase layers consists of Ti, and the other of the two vapor phase layers consists of Al.

* * * * *